United States Patent [19]

Stevens et al.

[11] Patent Number: 4,784,973
[45] Date of Patent: Nov. 15, 1988

[54] SEMICONDUCTOR CONTACT SILICIDE/NITRIDE PROCESS WITH CONTROL FOR SILICIDE THICKNESS

[75] Inventors: E. Henry Stevens; Paul J. McClure; Christopher W. Hill, all of Colorado Springs, Colo.

[73] Assignee: INMOS Corporation, Colorado Springs, Colo.

[21] Appl. No.: 88,681

[22] Filed: Aug. 24, 1987

[51] Int. Cl.$^4$ .......................................... H01L 21/283
[52] U.S. Cl. .................... 437/200; 437/190; 437/192; 437/239; 437/242; 437/161; 148/DIG. 147; 148/DIG. 112; 148/DIG. 118
[58] Field of Search ............... 437/192, 190, 200, 201, 437/195, 178, 179, 238, 239, 241, 242, 161; 357/67, 71; 148/DIG. 147, DIG. 112, DIG. 118

[56] References Cited

U.S. PATENT DOCUMENTS

| | | | |
|---|---|---|---|
| 3,825,442 | 7/1974 | Moore | 437/982 |
| 4,404,733 | 9/1983 | Sasaki | 437/187 X |
| 4,545,116 | 10/1985 | Lau | 29/591 |
| 4,657,628 | 4/1987 | Holloway et al. | 156/643 |
| 4,676,866 | 6/1987 | Tang et al. | 156/643 |
| 4,701,349 | 10/1987 | Koyanagi et al. | 427/228 |
| 4,713,357 | 12/1987 | Imamura | 437/52 |
| 4,717,449 | 1/1988 | Erie et al. | 437/195 |
| 4,722,910 | 2/1988 | Yasaitis | 437/44 |

FOREIGN PATENT DOCUMENTS 61-137367  6/1986  Japan .

OTHER PUBLICATIONS

Ghate, P. B., *Thin Solid Films*, vol. 93, 1982, pp. 357-381.
Amick, J. A. et al., *J. Vac. Sci. Technol.*, vol. 14, No. 5, Sep./Oct. 1977, pp. 1053-1063.
Ting, C. Y., *J. Vac. Sci. Technol.*, vol. 21, No. 1, May/Jun. 1982, pp. 14-18.
Rosser, P. J et al., *Mat. Res. Soc. Symp. Proc.* vol. 37, 1985 Materials Research Society, Gibson et al., ed., pp. 607-612.
Rosser et al., *Vacuum Tech. Appl. & Ion Phys.*, vol. 35, No. 10-11, Oct.-Nov. 1985, pp. 419-434.

Primary Examiner—Brian E. Hearn
Assistant Examiner—T. N. Quach
Attorney, Agent, or Firm—Edward D. Manzo

[57] ABSTRACT

A titanium silicide/titanium nitride process is disclosed wherein the thickness of the titanium nitride can be regulated with respect to the titanium silicide. In particular, a control layer is formed in the contact opening during a reactive cycle to form a relatively thin (20 to 50 angstrom) control layer. Titanium is thereafter deposited and in another thermal reaction the control layer retards the development of titanium silicide without retarding the development of titanium nitride so that the thickness of titanium silicide is kept small. A double titanium process can also be used.

11 Claims, 2 Drawing Sheets

SEMICONDUCTOR CONTACT SILICIDE/NITRIDE PROCESS WITH CONTROL FOR SILICIDE THICKNESS

BACKGROUND OF THE INVENTION

The present invention relates to a process in the integrated circuit fabrication art, and particularly concerns the formation of contact regions and metallurgic barriers thereover.

In the fabrication of integrated circuits, silicon is commonly used in its monocrystalline form as a substrate and in its polycrystalline form for gate electrodes and interconnects. Aluminum is commonly used as a conductor and especially for forming contacts or interconnects. One of the problems is that silicon is soluble in or diffuses into some metals such as aluminum. Thus, when a contact is formed by opening a contact window to, for example, a source or drain region formed in a silicon substrate and aluminum is used to fill the contact opening, some of the silicon dissolves, resulting in what is generally called a "spike" which extends downward from the contact. If the spike goes all the way through the source/drain region or other underlying region, then the transistor will be ruined by a "spiked junction."

To prevent this, titanium nitride can be used as a metallurgic barrier against the reaction between the silicon substrate and aluminum contact material. Thus, when the aluminum is separated from the silicon by a titanium nitride layer, spiking is reduced or stopped entirely. One can form titanium nitride by reacting pure titanium with nitrogen, but it is difficult nevertheless to obtain a good barrier quality. First, one desires a barrier layer which is not too thin. Second, the barrier layer formed of titanium nitride should have trace amounts of impurities. It is believed that impurities such as oxygen incorporated in the barrier improve the barrier quality by inhibiting diffusion of silicon atoms through the barrier along titanium nitride grain boundaries. Also, the barrier layer should not be in a state of tensile stress, as a stressed layer is believed to be less effective in preventing diffusion of silicon. Lower tensile or compressive stress is preferred.

Ordinarily, after titanium is deposited over a contact opening to a region in a silicon substrate, when titanium nitride is being formed, by a reaction in a nitrogen atmosphere, some of the titanium in the contact opening will react with the silicon to form titanium silicide. The titanium silicide forms a low resistance contact to the region in the substrate. Titanium silicide, however, is not a barrier material and can cause the juction to leak if the amount of titanium silicide is excessive.

Moreover, titanium silicide forms relatively quickly compared to titanium nitride, and as a result, if titanium is placed over a contact opening and reacted in a nitrogen atmosphere, a relatively substantial amount of titanium silicide forms compared to the amount of titanium nitride. The rates of the titanium-silicon reaction and the titanium-nitrogen reaction determine the thickness of these two layers. Because these two rates cannot be controlled independently, it has not been possible to control the relative thickness of these two layers when they are simultaneously formed. In fact, one desires to obtain only a thin layer of titanium silicide because any more would create high tensile stress in the contact.

Another problem with the prior art is that it does not introduce controlled amounts of oxygen or other elements into the titanium nitride film when titanium nitride is being formed by direct thermal reaction. The oxygen or other elements are believed to fill the grain boundaries in the titanium nitride.

It therefore is the object of the present invention to overcome these problems of the prior art processes.

SUMMARY OF THE INVENTION

A new process having two cooperating broad aspects has been developed to overcome these deficiencies of the prior art. According to the first broad aspect of the present invention, a control layer is formed over contact openings to transistor terminal regions in an integrated circuit (or wafer). Preferably the control layer is relatively thin and comprises a compound of silicon, oxygen and nitrogen, although silicon oxide can be used. This control layer (or region) is formed preferably by a thermal treatment. Next, a transition metal, such as titanium, or another material used in forming a barrier is established over the contact opening, illustratively by deposition. The titanium then is reacted during another thermal treatment to form a compound of titanium, silicon, oxygen and nitrogen in the contact region and a compound of titanium, oxygen and nitrogen at other regions. This latter compound of titanium, oxygen and nitrogen is useful as a metallurgic barrier over the contact regions. While this is occurring, the control layer can allow oxygen to enter the titanium. Also, a region of titanium silicide forms under the control layer, which disappears. The control layer is believed to retard the rate of diffusion of silicon into the titanium so that the thickness of the titanium silicide formed is reduced.

According to the second broad aspect of the present invention, a second layer of a transition metal, such as titanium, or other material used in forming a barrier is established, preferably by deposition. A thermal reaction in a nitridating environment converts this second titanium layer (when used) substantially entirely to titanium nitride. The titanium nitride formed during the previously-mentioned thermal cycle acts as a barrier to silicon diffusion during the next thermal cycle. The titanium silicide formed in the first portion of the process forms a low resistance electrical contact to transistor terminal regions or may be used as a reduced sheet resistance conductor or both. The titanium nitride can be used as a metallurgic barrier (a diffusion barrier) or as an interconnect material or both.

This sequence of reactive thermal cycles permits the properties of the contact and barrier to be controlled to meet stringent requirements imposed by integrated circuit processing which occurs subsequent to the formation of the contact and the barrier. The contact region and the barrier region thicknesses can be adjusted to suit individual applications.

It will be appreciated that the control layer aspect of the invention need not be combined with the double metallurgic layer aspect as recited herein, nor is it necessary that the second aspect of the present invention be practiced in conjunction with the control layer aspect. However the two aspects of this invention when used in combination yield a particularly salutory result. It has been determined experimentally that, for example, a process change using both a control layer and a double titanium nitride process as described herein completely eliminates the extensive problem of spiking.

BRIEF DESCRIPTION OF THE DRAWINGS

In describing the present invention, reference will be made to the accompanying drawings wherein like reference numerals refer to like portions thereof and wherein.

DESCRIPTION OF PREFERRED EMBODIMENTS

Figure 1:
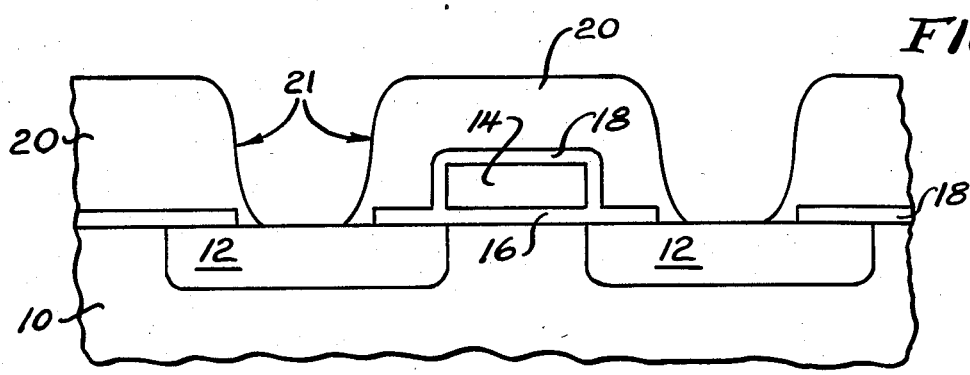
FIG. 1 illustrates a cross-sectional view of various regions of a transistor in an integrated circuit with contact openings established to its source and drain regions through a relatively thick dielectric material.

Referring now to FIG. 1, a representative cross-sectional view is shown of various portions of a semiconductor integrated circuit. A substrate 10 illustratively formed of silicon includes source and drain regions 12 formed therein. Regions 12 typically have thicknesses (depths) of 0.1 to 0.5 micrometers and are formed generally by ion implantation or diffusion. A gate electrode 14 is centered generally between the source and drain regions and is separated from the upper surface of substrate 10 by a gate dielectric 16. The gate dielectric is typically silicon oxide, silicon nitride, or silicon oxynitride having a thickness of between 100 angstroms and 400 angstroms. As seen, a layer 18 of silicon oxide, having a thickness typically in a range of 200 to 1000 angstroms, covers the top and side walls of gate electrode 14 and the upper surface of substrate 10. Frequently the source and drain will have been implanted prior to opening the contact openings described infra directly through the silicon oxide layer 18. After the ion implantation, there is a thermal anneal to activate the implanted ions, and to drive the laterally and downward.

Thereafter, a relatively thick dielectric layer 20 is established, typically by chemical vapor deposition ("CVD"). Layer 20 may comprise silicon oxide, silicon oxynitride, or silicon nitride. The typical thickness for layer 20 is in a region of 0.5 micrometer to 1.0 micrometer. This structure now will have contact openings 21 etched therethrough. Contact openings 21 are shown extending entirely through the dielectric 20 and the underlying silicon oxide region 18 thereby to expose a portion of the source and drain regions 12 so that electrical contact can be made thereto. It will be noted that the polysilicon gate electrode 14 remains covered by the silicon dioxide 18 and the CVD dielectric 20. Thus, FIG. 1 is ready for processing in accordance with the present invention. It is noted, however, that the present invention is not confined to forming contacts to source and drain regions only, and that contacts to other portions of integrated circuits can be made in accordance wth this invention.

According to the preferred embodiment of the invented process, the next step is a reactive thermal cycle. This may be done in either a conventional furnace tube or in a rapid thermal processor using high intensity infrared lamps for generating heat. The temperature during this cycle is in the range of 700° C. to 1100° C., but preferably 800° C. The atmosphere during this thermal cycle is, depending on the desired composition of the control layer being established, comprised of a mixture of oxygen, nitrogen, argon, water or ammonia.

Figure 2:
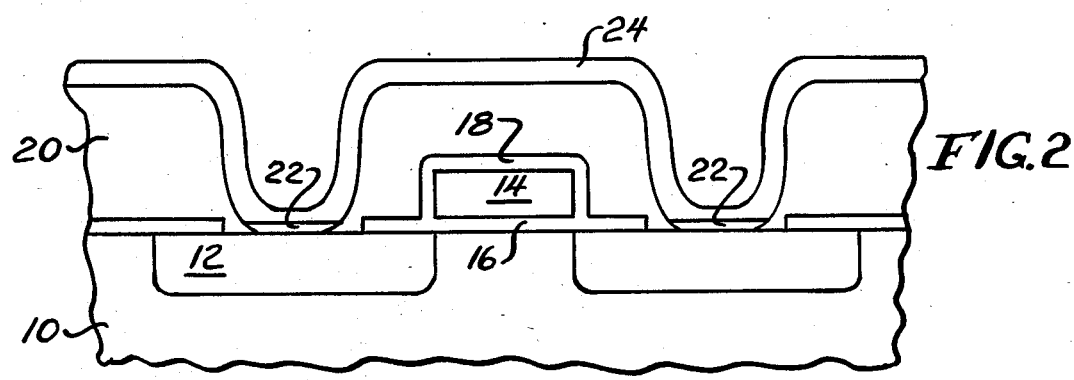
FIG. 2 represents the structure of FIG. 1 after establishment of a control layer and deposition of a first titanium layer in accordance with the present invention.

During this reactive cycle, a region 22 is formed (as seen in FIG. 2). Region 22 comprises the control layer in the preferred embodiment and is a compound of the generalized formula $Si_aO_bN_c$. In this formula, a, b, and c, illustrate that the chemical composition of region 22 may be controlled within some range by the choice of gas mixture used during the reactive thermal cycle. For example, with no nitrogen gas or ammonia gas present, silicon oxide ($SiO_2$) would be formed and used as a control layer. However, ordinarily it is contemplated that nitrogen will be present in some form in the atmosphere during this first thermal cycle so that region 22 will include nitrogen as part of its chemical composition. The typical thickness of region 22 is in the range of 20 angstroms to 50 angstroms, but preferably 20 angstroms.

Following the reactive cycle, a layer 24 of titanium is deposited by, for example, sputtering or electron beam evaporation under high vacuum conditions. Typical thicknesses for layer 24 are in the range of 200 angstroms to 2000 angstroms, but 700 angstroms is preferred.

Figure 3:
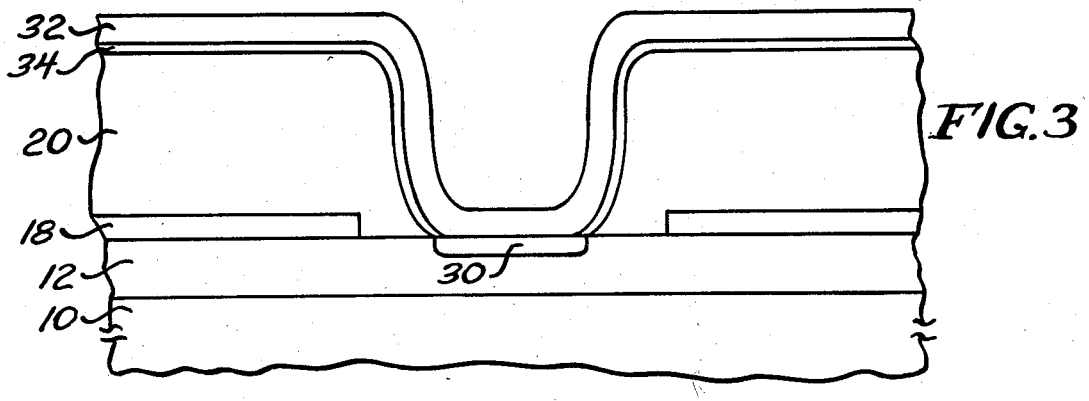
FIG. 3 is an enlarged scale view of the contact portion of FIG. 2 after a reactive thermal cycle.

FIG. 3 shows a portion of the structure of FIG. 2 in enlarged scale after a second reactive thermal cycle. This second thermal cycle can be performed in a conventional furnace or a rapid thermal processor. The temperature during this cycle is in the range of 550° C. to 800° C., and its duration is between 5 seconds and 5 minutes (if using rapid thermal processing) or 10 minutes to 1 hour (if using a furnace tube). In the preferred method, a conventional furnace tube at 650° C. is used for 15 minutes. The atmosphere during this second thermal cycle includes nitrogen, either in the form of nitrogen gas ($N_2$) or ammonia ($NH_3$), although a combination of nitrogen gas and ammonia gas can be used which also can be mixed with argon. Additionally, oxygen or water vapor can be added in small concentrations to the reactive gas mixture.

This thermal cycle of the integrated circuit (i.e., wafer in fabrication) in the reactive atmosphere results in the formation of various regions. Thus, referring to FIG. 3, the control layer 22 on top of the source/drain region 12 of FIG. 2 no longer is shown but instead a region 30 has been formed extending downward from the top surface of source/drain region 12. Region 30 is primarily titanium silicide, but traces of oxygen and nitrogen may be incorporated within region 30. In general, the composition of region 30 is described by the general formula $Ti_xO_yN_zSi_r$. Region 30 forms a low resistance electrical contact to the transistor source and drain regions 12.

It can be seen that region 30 is located only within the contact region in this preferred embodiment and has a thickness illustratively of 600 angstroms.

A layer 32 is shown as the uppermost layer in FIG. 3. It comprises primarily titanium nitride and results from the reaction of the titanium layer 24 with the nitrogen in the atmosphere during the second thermal cycle. However, oxygen preferably is incorporated in region 32 to promote its function as a metallurgic barrier. It is currently thought that oxygen must be incorporated along the grain boundaries within titanium nitride layer 32 to prevent rapid diffusion of materials along these grain boundaries. The general formula for layer 32 is $Ti_uO_vN_w$.

A layer 34 is also shown in FIG. 3 between layer 32 and dielectric layer 20. Region 34 is primarily titanium nitride with small amounts of silicon and oxygen therein. This compound is formed during the second reactive thermal cycle when part of the titanium of layer 24 reacts with the glass of dielectric 20. Dielectric 20 typically includes silicon.

In forming regions 30 and 32 simultaneously during this second reactive thermal cycle, the thickness of region 30 must be kept small compared to the thickness of the source or drain region 12 so that the properties of the diode formed between source or drain region 12 and substrate 10 will not be degraded. Also, oxygen should be incorporated, as mentioned, in region 32. Formation of the control layer 22 prior to the second reactive thermal cycle permits both of these requirements to be achieved. Layer 22 impedes the transport of reactants involved in forming region 30 so that region 30, primarily of silicide, is smaller than it would otherwise have been, had control region 22 not been present. While region 22 retards the rate of formation of silicide, it nevertheless has little effect on the rate of formation of layer 32. Region 22 also acts as a source of oxygen for incorporation in layer 32. Oxygen from region 22 enters the titanium. By proper choices of the thickness and composition of region 22, the thicknesses of regions 30 and 32 can be controlled to desired values. Region 22 as noted is consumed during this cycle and may thus be referred to as "sacrificial". It will be seen, therefore, that formation of region 22 at the exposed portion of the contact opening after a first thermal cycle permits the simultaneous formation of a low resistance electrical contact (region 30) and a good metallurgic barrier (layer 32) over that contact. This structure, illustrated in FIG. 3, can now be processed in accordance with standard process flows which would include plugging or filling the contact opening.

Figure 4:
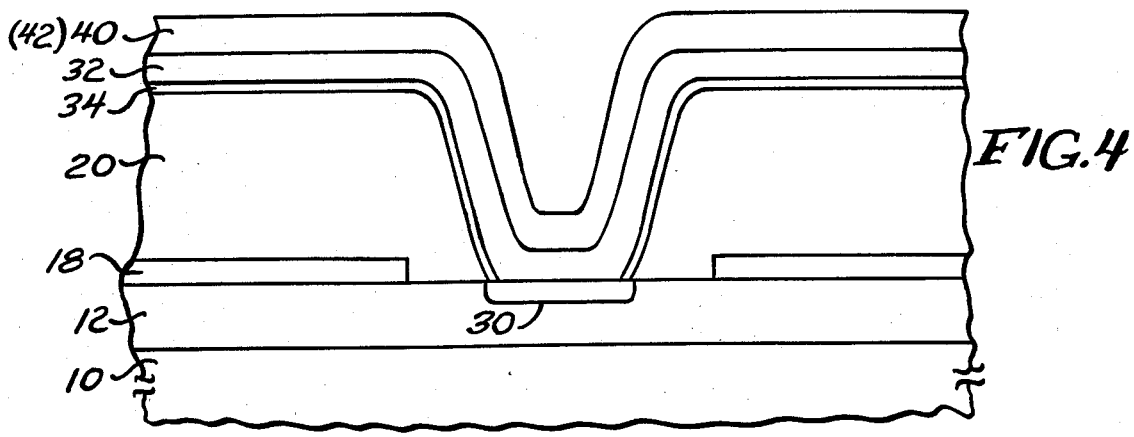
FIG. 4 represents the structure of FIG. 3 with a second layer of titanium added thereover and further represents the same structure after a thermal reaction in a nitridating environment.

However, according to a further aspect of the present invention, another barrier layer is formed. Referring to FIG. 4, according to this further processing, another layer 40 of titanium, illustratively between 400 and 2000 angstroms thick, is next deposited on top of layer 32 and the integrated circuit (wafer) is exposed to a third thermal cycle in a nitridating atmosphere of nitrogen or ammonia gas. This results in the formation of a layer 42 of titanium nitride having a thickness of between 400 and 2000 angstroms, but preferably 700 angstroms. Preferably, this thermal cycle is at 650° C. for 30 minutes. During this third thermal cycle, the previously formed barrier layer 32 prevents the diffusion of silicon from the source/drain region 12 or substrate 10 into titanium layer 40 so that it converts entirely into a titanium nitride layer 42. (For this reason, the upper layer in FIG. 4 is labeled both 40 and 42—which occur at different times.) It will be appreciated that because of this result, the final total thickness of titanium nitride can be controlled accurately.

Figure 5:
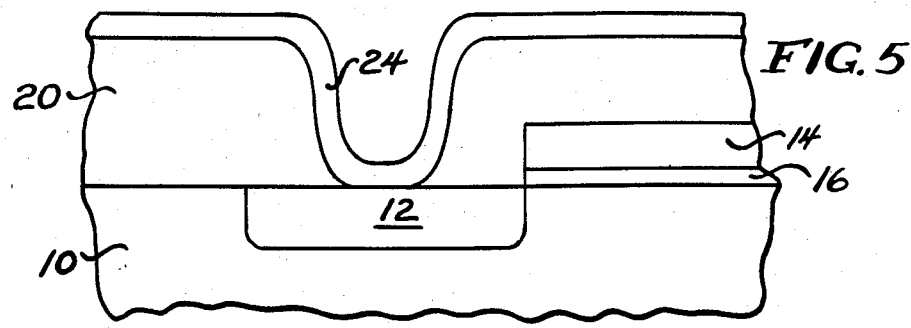
FIG. 5 represents a portion of a transistor being processed according to the present invention but without using the control layer.
Figure 6:
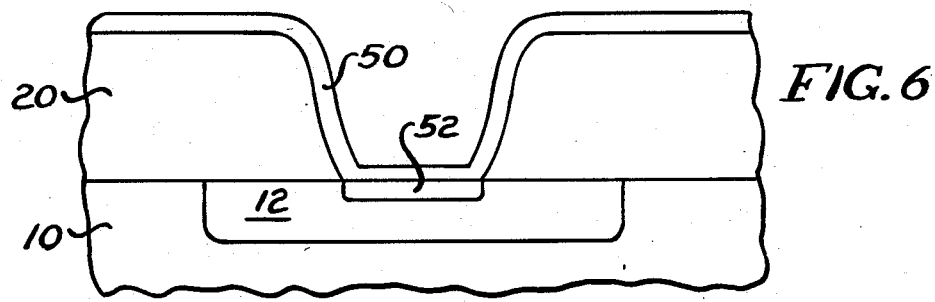
FIG. 6 illustrates the structure of FIG. 5 after a thermal cycle in a nitridating environment.
Figure 7:
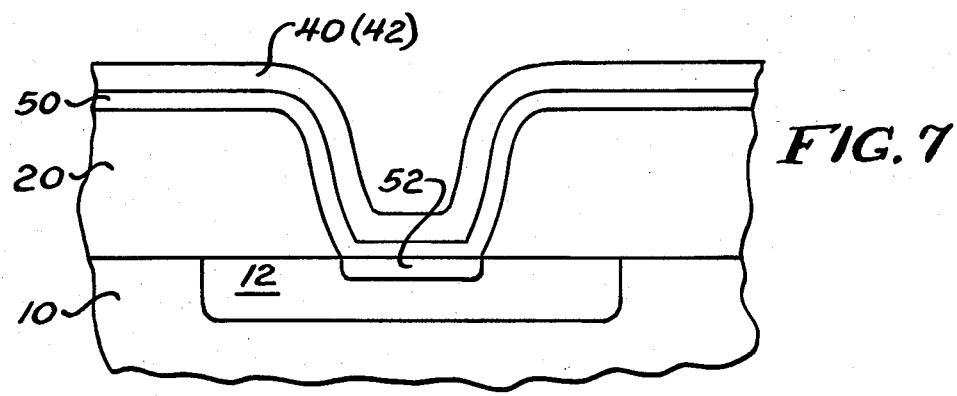
FIG. 7 represents the structure of FIG. 6 after deposition of a second titanium layer and a reaction thereof in a nitridating environment in a thermal cycle.

As mentioned supra, the double barrier layer aspect of the present invention can be practiced independently of the control layer aspect, although preferably these two process steps are practiced in combination to achieve the best results. FIGS. 5, 6 and 7 are used to illustrate an application of the double barrier layer of the invention without inclusion of the control layer. Corresponding regions will use the same numbering as given in FIGS. 1 to 4.

Thus, referring to FIG. 5, a substrate 10 is formed illustratively of single crystal silicon and includes a representative region 12 therein such as a source or drain region to which electrical contact is to be made. Next to region 12 is a gate electrode 14 illustratively comprising polysilicon which is separated from underlying substrate 10 by a gate oxide 16. A relatively thick dielectric 20 such as silicon oxide, phosphosilicate glass (PSG) or borophosphosilicate glass (BPSG) covers the surface of substrate 10 and the top and sides of gate electrode 14. The thin layer of oxide covering the top and sides of gate electrode 14 shown in FIGS. 1, 2 and 3 as layer 18 may be omitted, and is not shown in these FIGS. 5, 6 and 7.

A contact opening will have been etched to expose at least part of region 12 to which contact is to be made. A layer 24 of material which will become a diffusion or metallurgic barrier such as a transition metal and especially titanium is shown in FIG. 5. Layer 24 is deposited after the contact openings have been formed. Layer 24 is typically between 400 and 2000 angstroms, preferably 700 angstroms thick.

After layer 24 is established, the integrated circuit (or wafer containing the circuit) is thermally cycled in a nitridating atmosphere so that the titanium (or other material) can react with the atmosphere. This thermal cycle may be performed in a conventional furnace tube or, as mentioned, nn a rapid thermal processor in the temperature range of 500 to 800° C. In the case of furnace tube processing, the cycle time is typically between 10 and 240 minutes. Preferably a temperature of 650° C. is used for 15 minutes. In the case of rapid thermal processing using heat lamps, for example, the thermal treatment is typically 15 seconds to 10 minutes long. The atmosphere during the thermal cycle is either nitrogen or ammonia gas, or a combination thereof, and may include small amounts of hydrogen, oxygen or water vapor, depending on the desired composition of the layer being formed. During this reactive cycle, titanium layer 24 is converted into a layer 50 comprising primarily titanium nitride. However, the further amounts of hydrogen, oxygen or water vapor improve the performance of layer 50 by virtue of hydrogen or oxygen included along the grain boundaries of the titanium nitride. This enhances the performance of titanium nitride layer 50 as a metallurgic barrier against the migration or diffusion of silicon from regions 10 or 12 into the contact plug or interconnect used to fill the contact opening. Also, during this first thermal cycle, a region 52 of titanium silicide is formed in the contact opening by a reaction between the lower part of titanium layer 24 and the upper part of source or drain region 12 in the contact opening.

After this first thermal cycling, another layer 40, preferably formed of titanium, is deposited on top of titanium nitride layer 50. Layer 40 has a thickness between 400 and 2000 angstroms. Now a second thermal cycle occurs to react layer 40 with the atmosphere during the thermal cycle. Such atmosphere is identical to the atmosphere in the first thermal cycle, but this thermal cycle perferably occurs at 650° C. for 30 minutes. As a result, titanium layer 40 reacts with the atmosphere to form a titanium nitride layer 42 of substantially the same thickness as layer 40. Consequently, in FIG. 7, the same layer is shown as having two reference numerals 40 and 42, rather than showing the identical figure but changing reference numeral 40 (indicating titanium) to reference numeral 42 (indicating titanium nitride).

During the second thermal cycle, silicon from region 10 or 12 or from titanium silicide region 52 is prevented from migrating or diffusing into layer 42 by virtue of the presence of titanium nitride layer 50. The titanium silicide 52 formed during the first thermal cycle and illustrated in FIG. 6 is confined to regions below layer 50. Thus, during the second thermal cycle, as explained supra with respect to FIG. 4, the first-formed titanium nitride layer, in this case layer 50 (layers 32 and 34 in FIG. 4), serves as a metallurgic barrier so that all of the second titanium layer 40 is converted entirely into a layer 42 of titanium nitride. This permits control over the final total thickness of titanium nitride in the resulting structure.

The final thickness of titanium silicide region 52 is determined primarily by the thickness of the first deposited titanium layer 24. The final thickness of the titanium nitride (which includes regions 50 and 42) is determined by the thickness of both of the deposited titanium layers. By controlling the thicknesses of the two titanium depositions, and taking advantage of the diffusion barrier properties of the first-formed titanium nitride layer, one can control the relative thickness of titanium nitride to titanium silicide.

Consequently, by using this double barrier layer process, it is possible to control independently the thicknesses of thermally formed nitride and silicide in the contact region The titanium silicide layer formed may be used as a low resistance electrical contact, a low sheet resistance conductor or both. Titanium nitride is used as a metallurgic barrier, a local interconnect material, or both.

It should be appreciated that various modifications can be made within the scope of the present invention which is not limited to the embodiments described herein but instead is defined by the accompanying claims.

What is claimed as the invention is:

1. In the fabrication of an integrated circuit, a process for establishing an electrical contact at a contact opening in an insulative material to an underlying silicon region of said integrated circuit and for forming a metallurgic barrier over said contact comprising the steps of:
    establishing a relatively thin control region in said contact opening over said underlying silicon region, said control region comprising a compound including silicon oxygen and nitrogen; then
    establishing a first layer comprising a transition metal over said insulative material and said control region; and then
    thermally cycling the integrated circuit to convert at least part of said transition metal layer into a metallurgic barrier and to establish a low resistance silicide contact region below said barrier in said underlying silicon region previously exposed by said contact opening, said control region being replaced development of said silicide contact region in said contat opening, said control region being replaced during said thermally cycling step by said silicide region, said control region thereby permitting the thickness of said silicide contact region relative to said metallurgic barrier to be controlled.

2. The process of claim 1 wherein said step of establishing a control region comprises surrounding said contact opening with a reactive gas mixture and thermally cycling said integrated circuit to form said control region by reacting a portion of said underlying region with said gas mixture during said thermal cycle.

3. The process according to claim 1, wherin said thermally cycling step comprises exposing said metal first layer to a nitridating atmosphere and reacting said metal first layer with said atmosphere during said cycling step.

4. The process according to claim 3, wherein said metal layer comprises titanium and wherein said nitridating atmosphere includes nitrogen or ammonia gas.

5. The process according to claim 1 wherein said first layer comprises titanium, wherein said thermally cycling step comprises thermally cycling said integrated circuit in an atmosphere containing nitrogen or ammonia thereby to form titanium nitride.

6. The process according to claim 1 wherein said step of establishing a control region comprises thermally cycling said integrated circuit prior to said step of establishing a first layer of transition metal, by reacting said exposed underlying layer in an atmosphere to form said control region.

7. The process according to claim 6 wherein said control layer supplies oxygen to grain boundaries in the metallurgic barrier.

8. The process according to claim 6 wherein said atmosphere includes nitrogen.

9. The process according to claim 8 wherein said control layer supplies nitrogen to grain boundaries in the metullurgic barrier.

10. The process of claim 1 wherein said contact opening extends through a dielectric containing silicon to expose said underlying region, said underlying region also containing silicon, wherein said control region is established on the exposed surface of said underlying region within said contact opening, wherein said establishing a first layer of transition metal comprises depositing a layer of titanium over said dielectric and said control region, and wherein said process includes establishing a region adjoining said dielectric, said region comprising a compound or mixture of titanium, nitrogen, silicon, and oxygen.

11. The process of claim 1 wherein said establishing a control region step comprises establishing a control region in said contact opening only.

* * * * *